United States Patent [19]
Tignor et al.

[11] Patent Number: 5,132,757
[45] Date of Patent: Jul. 21, 1992

[54] LDD FIELD EFFECT TRANSISTOR HAVING A LARGE REPRODUCIBLE SATURATION CURRENT

[75] Inventors: Stephen L. Tignor, Escondido; Michael A. Stuber, Vista; Jerome L. Brekken, San Marcos, all of Calif.

[73] Assignee: Unisys Corporation, Blue Bell, Pa.

[21] Appl. No.: 614,890

[22] Filed: Nov. 16, 1990

[51] Int. Cl.⁵ .................................. H01L 29/78
[52] U.S. Cl. .............................. 357/23.3; 357/41
[58] Field of Search ............ 357/23.3, 41; 437/44

[56] References Cited

U.S. PATENT DOCUMENTS

| | | | |
|---|---|---|---|
| 4,356,623 | 11/1982 | Hunter | 357/23.3 |
| 4,740,484 | 4/1988 | Norström et al. | 437/44 |
| 4,855,247 | 8/1989 | Ma et al. | 357/23.3 |
| 4,894,694 | 1/1990 | Chan et al. | 357/23.3 |
| 4,906,589 | 3/1990 | Chao | 357/23.3 |
| 4,912,061 | 3/1990 | Nasr | 357/23.3 |
| 4,948,744 | 8/1990 | Kita | 357/23.3 |

FOREIGN PATENT DOCUMENTS

| | | | |
|---|---|---|---|
| 62-94985 | 5/1987 | Japan | 437/44 |
| 63-70458 | 3/1988 | Japan | 437/44 |
| 63-257231 | 10/1988 | Japan | 437/44 |
| 63-292678 | 11/1988 | Japan | 437/44 |
| 2-35740 | 2/1990 | Japan | 437/44 |
| 2-78229 | 3/1990 | Japan | 437/44 |

OTHER PUBLICATIONS

IEEE Transactons on Electron Devices, vol. ED-29, No. 4, Apr. 1982, "Fabrication of High-Performance LDD FET's with Oxide Sidewall-Spacer Technology" by Tsang et al, pp. 590-596.

IEDM, 1984, "Characterization of As-P Double Diffused Drain Structure" by Balasubramanyam et al, pp. 782-785.

Primary Examiner—Rolf Hille
Assistant Examiner—Steven Loke
Attorney, Agent, or Firm—Charles J. Fassbender; Mark T. Starr

[57] ABSTRACT

An LDD field effect transistor is fabricated by a series of process steps in which throughout the fabrication process, the transistor's polysilicon gate is protected from being oxidized on its edges near the gate insulator. Some of the process steps during which the above protection occurs includes steps for forming spacers on the sidewalls of the transistor's gate, and steps for activating the LDD source-drain regions with high temperature anneals. Due to this protection from oxidation, none of the silicon in the edges of the gate is consumed or converted to silicon dioxide at any stage of the fabrication process. Consequently, the distance by which the edges of the gate are spaced over the channel remains unaltered throughout the fabrication process; and, this physical feature of the gate makes the transistor's saturation current large with little variance.

7 Claims, 6 Drawing Sheets

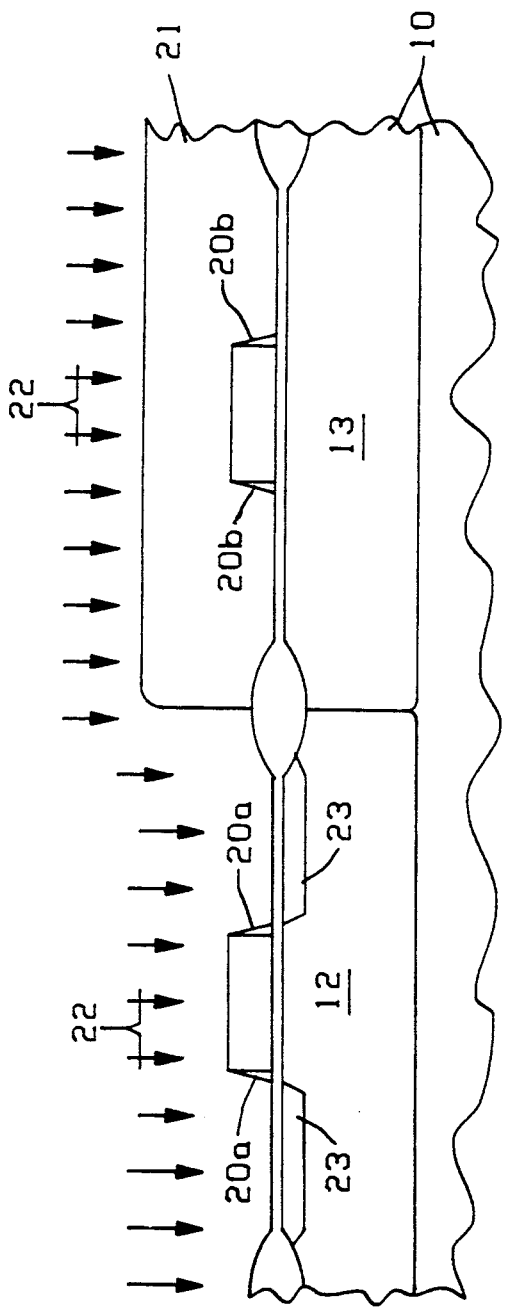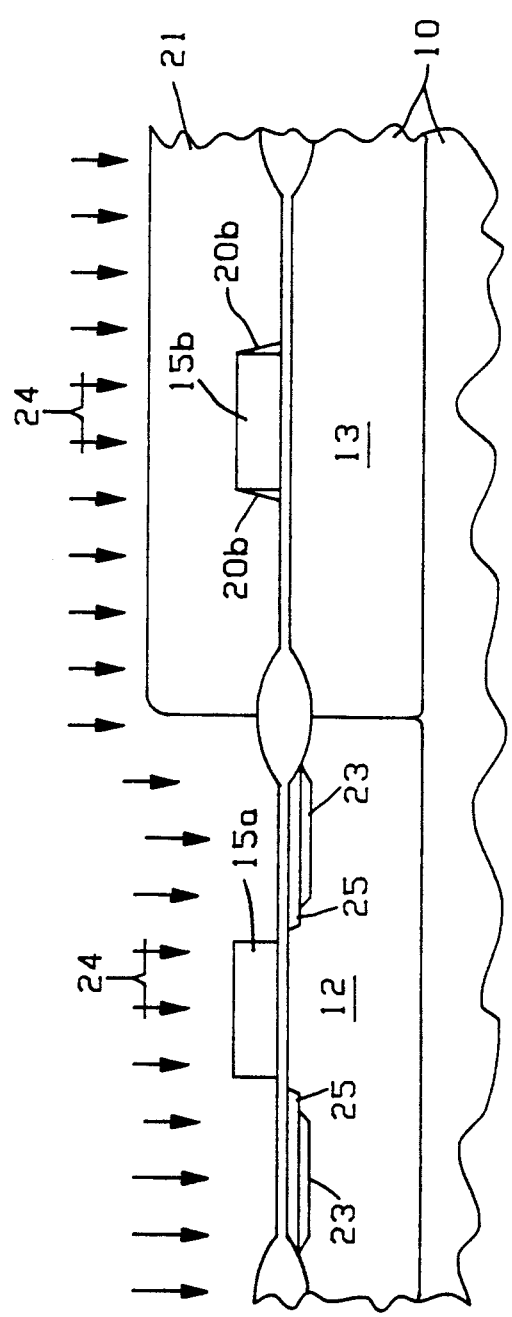

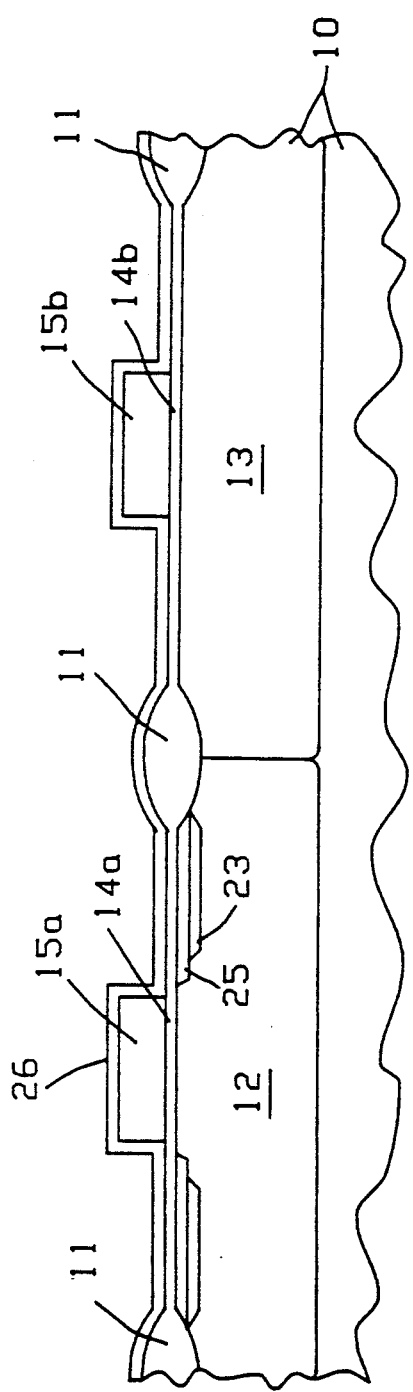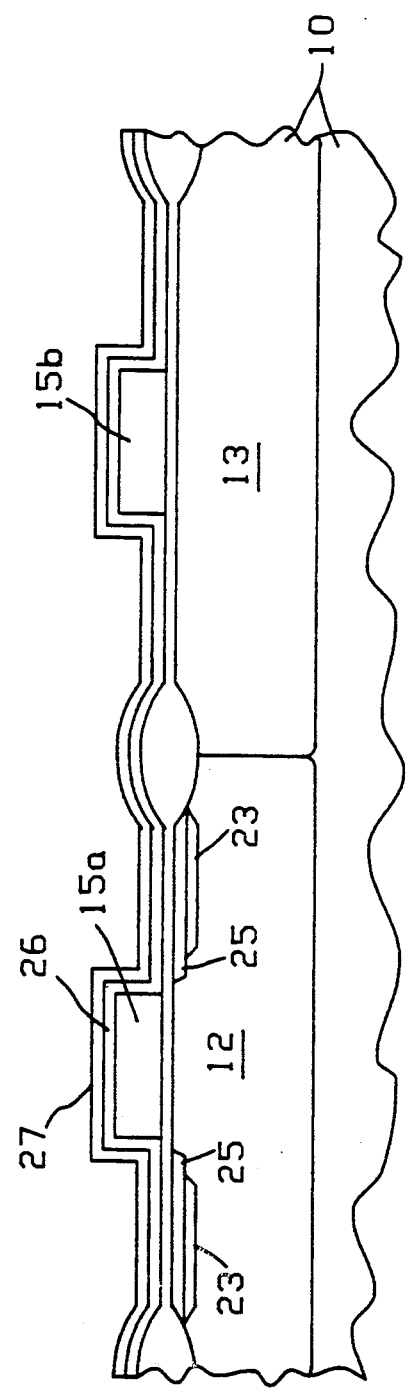

LDD FIELD EFFECT TRANSISTOR HAVING A LARGE REPRODUCIBLE SATURATION CURRENT

BACKGROUND OF THE INVENTION

This invention relates to the physical structure of lightly doped drain field effect transistors (LDD transistors), and methods of fabricating same, such that the transistor has a large saturation current with small tolerances.

In the semiconductor industry, many attempts have been made to fabricate field effect transistors with a reduced size in order that more and more circuitry can be placed on a single integrated circuit chip. As a result of those efforts, LDD transistors have been developed. Various processes for forming LDD transistors, and the resulting structures, are described in the following technical papers: (1) "Experimental Technology and Characterization of Self-Aligned 0.1 um Gate Length Low-Temperature Operation NMOS Devices" by Sai-Halasz et al published in the IEDM of 1987 at pages 397–400; (2) "$Si_3N_4/SiO_2$ Spacer Induced High Reliability in LDDMOSFET and Its Simple Degradation Model" by T. Mizumo et al published in the IEDM of 1988 at pages 234–235; (3) "Poly-Gate Sidewall Oxidation Induced Submicrometer MOSFET Degradation" by Pfiester et al published in the IEEE Electron Device Letters, Volume 10, Number 8, August 1989 at pages 367–369; (4) "Submicrometer Salicide CMOS Devices with Self-Aligned Shallow/Deep Junctions" by Lu et al published in the IEEE Electron Device Letters, Volume 10, Number 11, November 1990 at pages 487–489; and (5) "A Poly-Framed LDD Sub-Half-Micrometer CMOS Technology" by Pfiester et al published in the IEEE Electron Device Letters, Volume 11, Number 11, November 1990 at pages 529–531.

In all of the above papers, a field effect transistor is described which has source and drain regions that are lightly doped adjacent to the transistor gate and are heavily doped at a space of several hundred angstroms from the gate. Such an LDD structure is desirable in submicron transistors because it reduces the electric field at the source and drain directly below the edges of the gate electrode; and, that in turn reduces hot carrier effects which produce long term shifts in the transistor's threshold voltage.

To change the doping from light to heavy in the source and drain regions, small submicron spacers are formed on the sidewalls of the gate electrode. These spacers are used as a mask, when the heavily doped portion of the source and drain is implanted, which keeps the heavy doping away from the gate electrode. However, in all of the process variations which the above referenced papers disclose, the present inventors have determined that a certain technical deficiency exists with the manner in which the spacer is fabricated.

Due to this deficiency, the transistor's saturation current is lowered; and, the range over which the transistor's saturation current will vary is increased. By definition, when the current through a field effect transistor is below its saturation level, an increase in the source-drain voltage with the gate voltage held constant will produce a linearly proportional increase in current; whereas when the saturation level is exceeded, the current through the field effect transistor remains essentially constant. Thus, a saturation current which is consistently large is desirable since it expands the voltage range over which the transistor can operate as a linear amplifier and increases the transistor's maximum output current or drive current.

Accordingly, a primary object of the invention is to provide an improved process for fabricating LDD field effect transistors in which the above described problems are overcome.

BRIEF SUMMARY OF THE INVENTION

With the present invention, an LDD field effect transistor is fabricated by a series of process steps in which throughout the fabrication process, the transistor's polysilicon gate is protected from being oxidized on its edges near the gate insulator. Some of the process steps during which the above protection occurs include steps for forming spacers on the transistors sidewalls, and steps for activating the LDD source-drain regions with high temperature anneals. Due to this protection from oxidation, none of the silicon in the edges of the gate is consumed or converted to silicon dioxide at any stage of the fabrication process; and consequently, the distance by which the edges of the gate are spaced over the channel remains unaltered throughout the fabrication process. This is important because if some of the silicon on the gate edges is consumed by oxidation in a nonreproducible fashion during the fabrication process, then the saturation current in the resulting transistors will be lowered and will vary widely.

BRIEF SUMMARY OF THE DRAWINGS

Various features and advantages of the invention are described herein in conjunction with the following drawings wherein:

FIGS. 1 through 8 are a series of greatly enlarged sectional views of a semiconductor substrate which illustrate various steps of a preferred process for fabricating LDD field effect transistors in accordance with the present invention;

DETAILED DESCRIPTION

Figure 1:
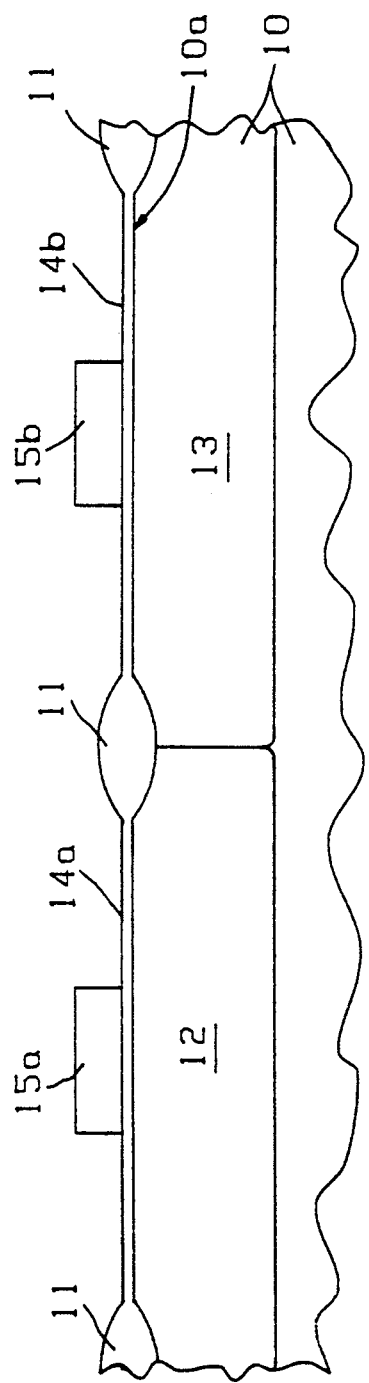

Referring now to the figures, a preferred process for fabricating LDD field effect transistors in accordance with the invention will be described in detail. Beginning with FIG. 1, it shows an initial step of the fabrication process. There, reference numeral 10 indicates a greatly enlarged sectional view of a portion of a semiconductor substrate; reference numeral 11 indicates field oxide that is patterned on the surface 10a of substrate 10 as a border which separates the transistors that are to be formed; reference numeral 12 indicates a P-type well in the substrate 10 in which one or more N-channel transistors will be fabricated; reference numeral 13 indicates an N-type well in the substrate 10 in which one or more P-channel transistors will be fabricated; reference numerals 14a and 14b indicate a gate oxide which respectively lie on top of the P-well 12 and the N-well 13; and reference numerals 15a and 15b indicate gate electrodes which respectively lie on top of the gate oxides 14a and 14b.

On the substrate 10, the above described structures 12, 14a, and 15a are repeated thousands of times, once for each N-channel transistor. Similarly, the above described structures 13, 14b, and 15b are also repeated thousands of times on substrate 10, once for each P-channel transistor. Suitably, the substrate 10 is made of monocrystalline silicon; the P-type well 12 is the substrate 10 doped with boron; the N-type well 13 is the substrate 10 doped with phosphorous; the gate oxides 14a and 14b are made of silicon dioxide and are 100–300 angstroms thick; and the gate electrodes 15a and 15b have a submicron width, are 3000 to 6000 angstroms thick, and are made of polycrystalline silicon having an N-type dopant.

Figure 2:
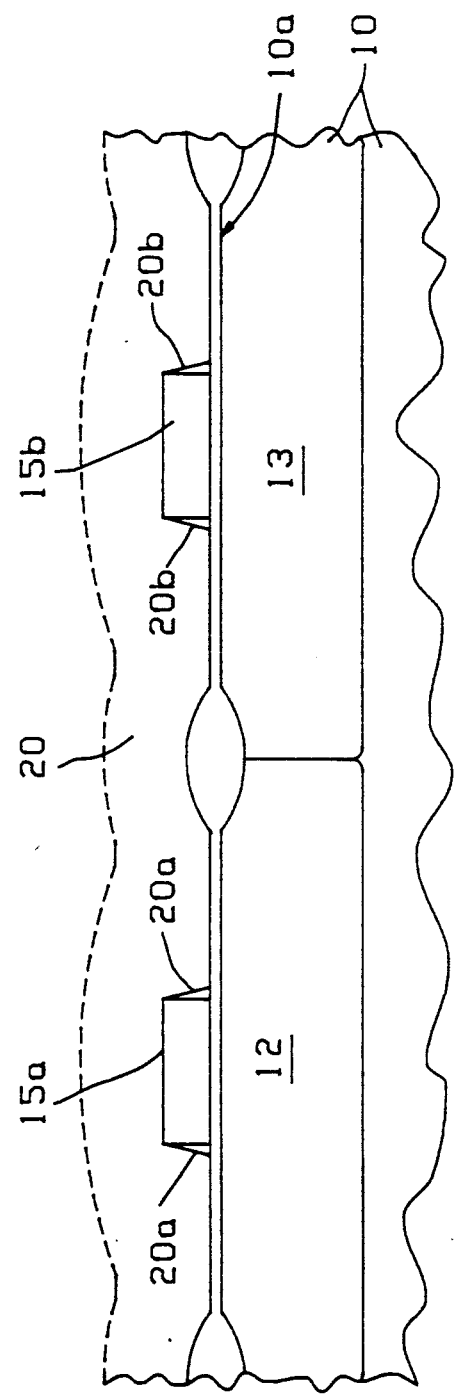

Subsequently in the fabrication process, a silicon dioxide layer 20 is deposited via a low pressure chemical vapor deposition (LPCVD) at a temperature of about 420° C. over the entire top surface of the FIG. 1 structure to a thickness of 3000–5000 angstroms. Suitably, this is achieved by flowing 35–45 standard cubic centimeters per minute (sccm) of $SiH_4$ and 70–80 sccm of $O_2$ and 40–50 sccm of $PH_3$ in a CVD reactor at 150–350 millitorr. Layer 20 is shown by a dashed line in FIG. 2 because following its deposition, it is subjected to an anisotropic etch which removes all of the layer except for spacers 20a and 20b which lie adjacent to the gate electrodes 15a and 15b respectively. Such an anisotropic etch is performed in a reactive ion etcher using $CHF_3+O_2$ as the etchant gas.

Thereafter, as FIG. 3 shows, a patterned layer of photoresist 21 is formed such that it overlies all of the N-type wells 13 and none of the P-type wells 12. With the photoresist layer 21 in place, the entire top surface of the FIG. 3 structure is subjected to a heavy implant of N-type dopant ions 22. This forms heavily doped source and drain regions 23 in the P-type well 12 between the spacers 20a and the field oxide 11. Suitably, the dopant ions 22 are arsenic ions; and they are implanted at 50–70 KEV with a density of $1-5\times10^{15}$ ions per $cm^2$.

Following the above implant, all of the spacers 20a which lie adjacent to the gate electrodes 15a are removed. This is achieved by stripping the spacers 20a with a wet etchant, such as a 50:1 mixture of $H_2O$ and HF. Thereafter, as is shown in FIG. 4, a light implant of N-type dopant ions 24 is performed. This forms lightly doped source and drain regions 25 in the P-type well 12 which are aligned to the gate electrode 15a. Suitably, the dopant ions 24 are phosphorous ions; and they are implanted at 40–60 KEV with a density of $0.5-5\times10^{13}$ ions per $cm^2$.

Thereafter, the photoresist layer 21 is removed; and, the spacers 20b are removed by a wet etch like the one which removed the spacers 20a. Subsequently, the entire surface of the resulting structure is covered with a layer of silicon dioxide 26 as shown in FIG. 5. This oxide layer 26 is one to two times as thick as the gate oxide 14a; and, it is formed by depositing silicon dioxide via a LPCVD. Suitably, this deposition is performed by flowing 40–50 sccm of dichlorosilane and 380–400 sccm of nitrous oxide in a CVD reactor at 750° C. to 825° C. and 300–600 millitorr.

During this deposition, as well as the deposition of layer 20, all of the silicon in the silicon dioxide layer is supplied by the chemical vapor. That is, the silicon dioxide layers 20 and 26 are not formed by oxidizing silicon in the gate electrodes 15a and 15b to silicon dioxide.

Subsequently, an oxygen impermeable layer 27 is deposited via another chemical vapor deposition at about 800° C. on top of the silicon dioxide layer 26. This step is shown in FIG. 6. Suitably, the layer 27 is made of silicon nitride; its thickness is from 1–3 times the thickness of the oxide layer 26; and it is formed by flowing 20–30 sccm of dichlorosilane and 110–130 sccm of ammonia into a CVD reactor at 750° C. to 850° C. and 300–400 millitorr.

Figure 7:
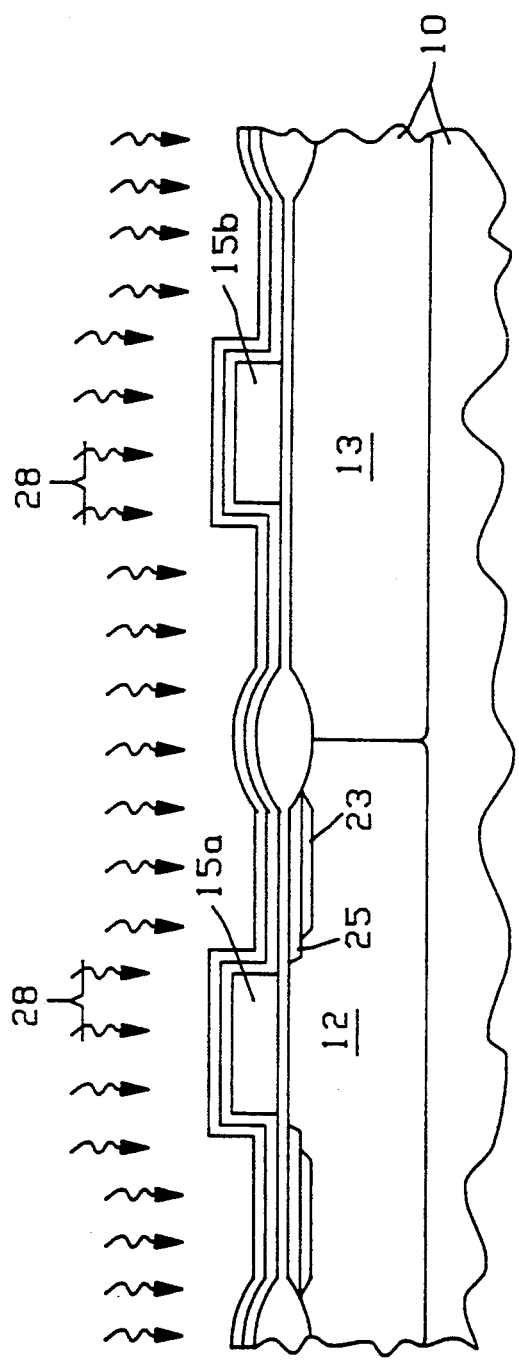

While the oxide layer 26 and nitride layer 27 are in place, a high temperature anneal step is performed. This is shown schematically in FIG. 7 wherein the arrows 28 indicate heat. Suitably, the anneal takes place at 920° C. and lasts about four hours. By this anneal, the ions which were implanted into the source and drain regions 23 and 25 diffuse down into the substrate and become "activated"—that is, the ions change from being interstitial in the lattice structure of substrate 10 to occupying lattice sites.

Following the anneal step, the nitride layer 27 and oxide layer 26 are subjected to an anisotropic etch. This etch is timed to strip all of the nitride layer 27 and an upper portion of the oxide layer 26 except for spacer portion 26a, 26b, 27a, and 27b which remain on the sidewalls of the gate electrodes 15a and 15b. These remaining portions are shown in FIG. 8.

Figure 8:
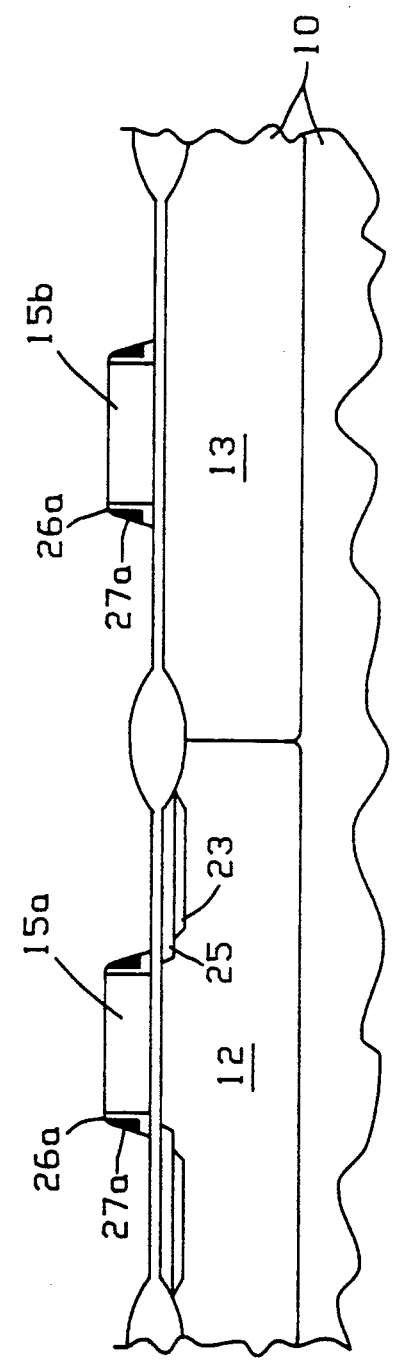

Utilizing the FIG. 8 structure, P-channel transistors are formed by covering the P-doped wells 12 with a patterned layer of photoresist, and implanting P-type ions into the portions of the well regions 13 which lie between the spacers 26b and 27b of gate electrode 15b and the field oxide 11. Thereafter, the entire surface of the resulting structure is covered by a thick CVD silicon dioxide film; the implants are activated by an anneal; and the P-channel transistors and N-channel transistors are selectively interconnected in a conventional fashion by forming patterned metal lines which interconnect the source, drain, and gate structures in any desired fashion. Suitably, the silicon dioxide film is 1 um −2 um thick; and it is formed by flowing 95–105 sccm of $SiH_4$ and 95–105 sccm of $B_2H_6$ and 190–210 sccm of $PH_3$ and 7–9 standard liters per minute of $O_2$ in a CVD reactor at 430° C. to 470° C. and atmospheric pressure.

A primary feature of the above described process is that the transistors which are produced have a saturation current which is large and which varies very little from one transistor to another. This feature occurs because with the above described process, none of the oxide layers 20 and 26 on the sidewalls of the gate electrode nor the oxide layers 14a and 14b on the bottom surface of the gate electrodes encroach upon the edges of the gate electrodes.

Figure 9:
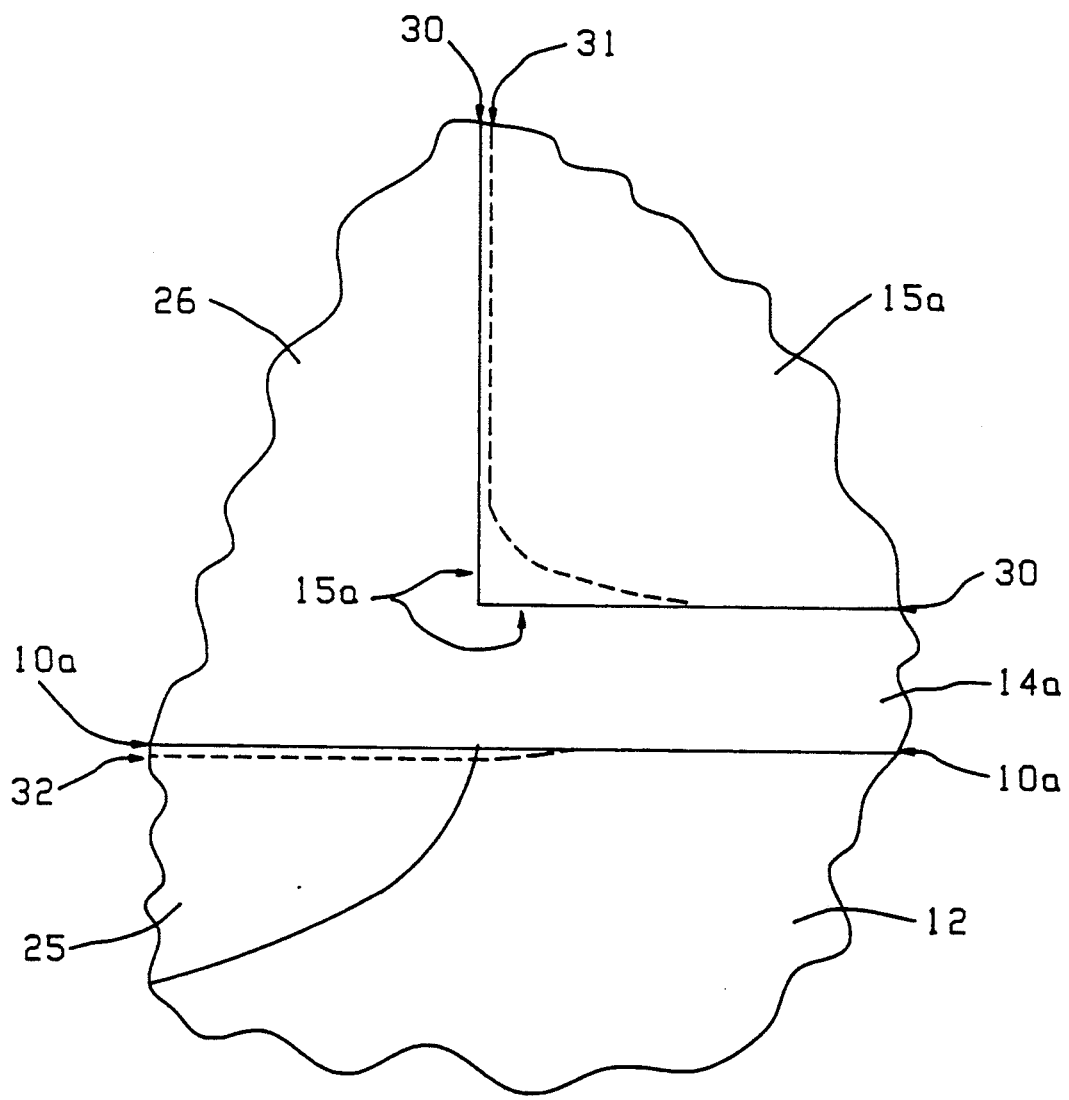
FIG. 9 is a blown up view which compares the shape of the edges of a transistors gate that is fabricated by the process steps of FIGS. 1-8 to the edge shape of a transistors gate from the prior art.

By comparison, such encroachment does occur when either one of the oxide layers 20 or 26 is thermally grown. To visualize this, reference should be made to FIG. 9 which is a blown up view of the bottom left corner of the gate electrode 15a and the adjoining structures. In FIG. 9 a solid line 30 shows the shape of the bottom left corner of the electrode 15a when the oxide layers 20 and 26 are deposited; and for comparison purposes, a dashed line 31 shows the shape of the gate electrode 15a when at least one of the oxide layers 20 and 26 is thermally grown. During a thermal growth silicon atoms on the surface of the gate electrode 15a are consumed and chemically converted to silicon dioxide. Further, this silicon consumption occurs more rapidly on the edges 15a' of the gate electrode than on its flat surfaces. In addition, some silicon consumption on the surface of substrate 10 occurs as is indicated by the dashed line 32. Due to all of this silicon consumption, the corners of the resulting gate electrode 15a become spaced further from the substrate surface 10a.

If the gate electrode has the shape as indicated by reference numeral 31 and the substrate surface has the shape as indicated by reference numeral 32, then the saturation current of the transistor is decreased from that which it would otherwise be for a gate having the shape 30 and substrate having the surface shape 10a. That is because the saturation current of a field-effect transistor varies inversely in a nonlinear fashion with the degree of encroachment by the silicon dioxide on the edges of the gate electrode. Further, this lowering of saturation current will vary from transistor to transistor in a nonreproducible manner since the amount of silicon which is consumed on the edges of each gate will vary depending upon the grain size of the polysilicon, grain orientation, dopant type, and dopant concentration.

A related feature of the above described process is that the effective length of the gate electrode 15a remains essentially unchanged throughout the steps of FIGS. 1-8. Saturation current in a field effect transistor is inversely proportional to the transistors effective gate length. By comparison, a gate which has been oxidized as indicated by reference numeral 31 in FIG. 9 has a widely varying effective gate length and thus has a larger manufacturing tolerance. By keeping the manufacturing tolerances of the effective gate length small, shorter gate electrodes can be fabricated which in turn makes the transistor switch faster. Conversely, as the manufacturing tolerances on the transistors effective gate length increases, the electrode must be made larger in order to insure that punch through (i.e. electrical shorts) between the source and drain regions does not occur.

Similar encroachment of silicon dioxide on the bottom corners of the gate electrode can also occur if oxygen atoms are allowed to penetrate the oxide layer 26 at any time after the layer 26 is deposited. This, however, is prevented by the silicon nitride layer 27. Also, the nitride layer 27 prevents the N-type dopants in the gate electrode 15b from out gassing during any high temperature step and contaminating the adjacent P-doped source and drain.

Figure 10:
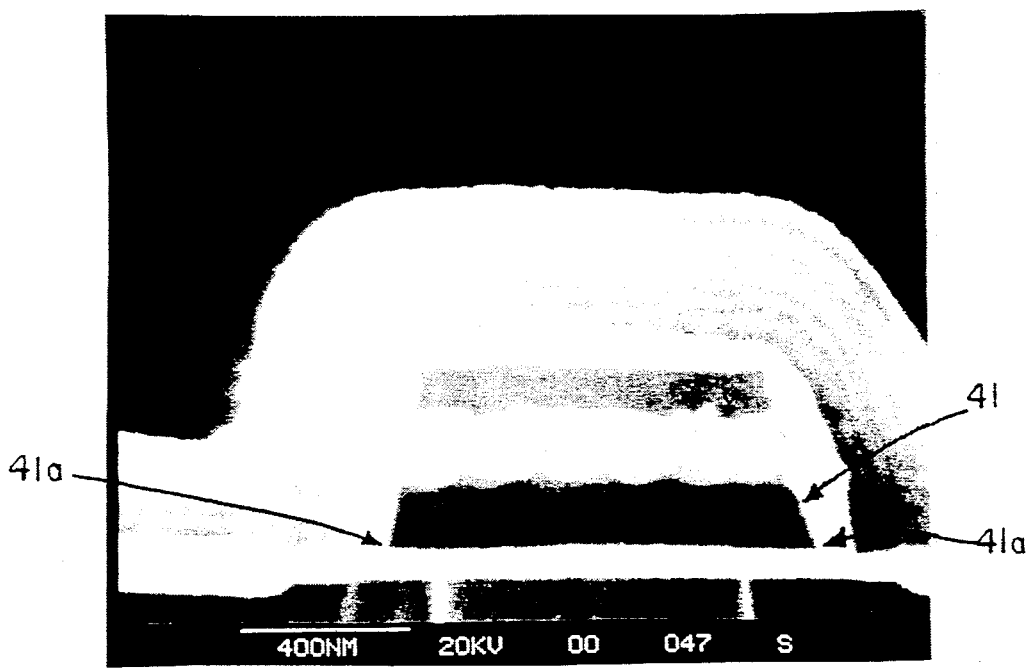
FIG. 10 is an electron micrograph of the gate of an actual transistor that was fabricated from the process steps of FIGS. 1-8; and, FIG. 11 is an electron micrograph, for comparison purposes, of the gate of a transistor that was fabricated by the prior art.
Figure 11:
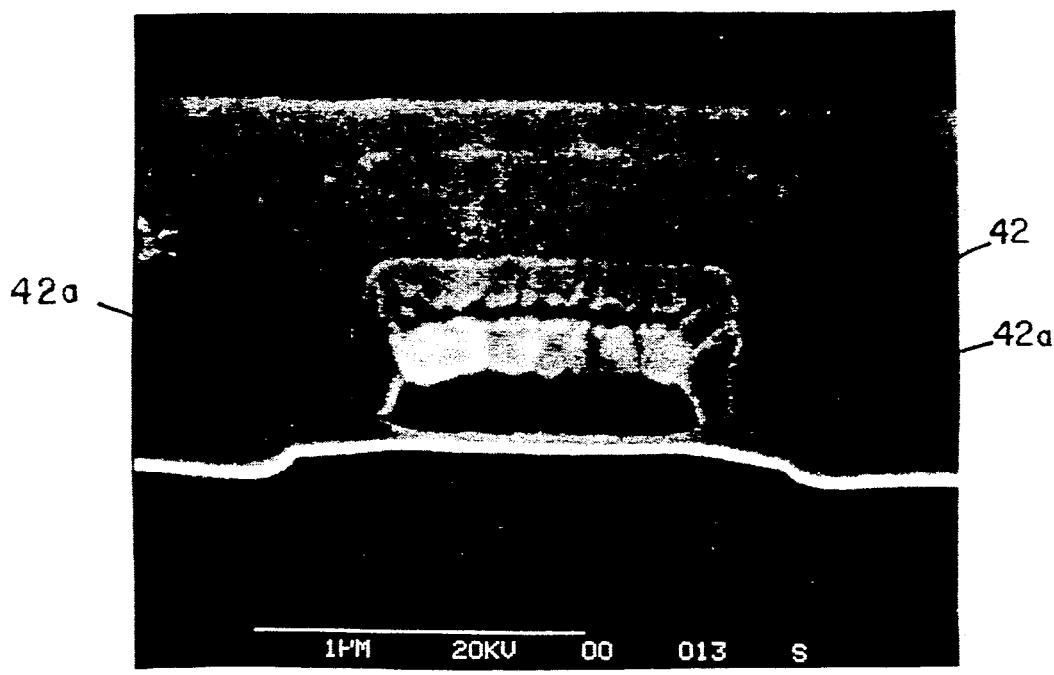

Some electron micrographs which verify that the above features are in fact achieved by the process of FIGS. 1-8 is shown in FIGS. 10 and 11. FIG. 10 is an electron micrograph of a cross section of a transistor which was fabricated by the process steps of FIGS. 1-8; whereas FIG. 11 is an electron micrograph of a transistor that was fabricated by a process in which the oxide layer 26 was thermally grown. Inspection of FIG. 10 clearly shows that the gate electrode 41 has no rounding on its edges 41a, and thus the gate's bottom surface is spaced uniformly from the substrate surface. By comparison, in the transistor in FIG. 11, the gate electrode 42 has rounded edges 42a due to oxidation of the silicon in those edges; and thus the bottom surface of the gate 42 is spaced from the substrate by a small distance at its center and by a large distance near its sidewalls.

To quantify the degree to which the saturation current increases by using the disclosed process of FIGS. 1-8, some transistors were fabricated using that process with a gate length of one micrometer. Saturation current for those transistors was then measured to be 18 milliamps. For comparison purposes, some other transistors were fabricated by a conventional process in which the edges 15a' of the gate were oxidized to 0.07 micrometers per side, and the final gate length as measured from side to side was again one micrometer. Saturation current for those transistors was measured to be 13.3 milliamps. Thus, for one micron gate length transistors, the process of FIGS. 1-8 increases the saturation current by about 35%! In addition, this percent increase is expected to get larger as the gate length of the transistor decreases.

A preferred embodiment of a field effect transistor, as well as a preferred process of fabricating that embodiment, has now been described in detail. In addition, many changes and modifications can be made to these details without departing from the nature and spirit of the invention. For example, the gate electrodes 15a and 15b can have a vertically layered structure wherein one of the layers is a metal silicide and another layer is polysilicon. Accordingly, it is understood that the invention is not limited to the above details but is defined by the appended claims.

What is claimed is:

1. A field effect transistor which is comprised of: a semiconductor substrate having a major surface; a gate oxide lying on said surface; a gate electrode having a bottom surface lying on said gate oxide and having sidewalls which extend away from said gate oxide; said gate electrode being comprised of an oxidizable material; an oxide layer on said sidewalls; and, an oxygen impervious layer lying on said oxide layer; wherein, the bottom surface of said gate electrode near said sidewalls and the bottom surface of said gate electrode midway between said sidewalls are spaced from said substrate surface by the same distance, and neither said oxide layer on said sidewalls nor said gate oxide encroach upon said oxidizable material in said gate to enlarge said distance near said sidewalls.

2. A transistor according to claim 1 wherein said bottom surface of said gate electrode and said substrate surface are spaced apart by said same distance beginning from midway between said sidewalls and continuing to within one-hundred angstroms from said sidewalls.

3. A transistor according to claim 2 wherein said oxygen impervious layer is silicon nitride.

4. A transistor according to claim 2 wherein said oxidizable material in said gate includes polycrystalline silicon.

5. A transistor according to claim 2 wherein said gate is comprised of a layer of polycrystalline silicon and a layer of a metal silicide.

6. A transistor according to claim 2 which further includes N-type source and drain regions in said substrate.

7. A transistor according to claim 2 which further includes P-type source and drain regions in said substrate.

* * * * *